United States Patent [19]

Hadjizadeh-Amini

[11] Patent Number: 5,200,351
[45] Date of Patent: Apr. 6, 1993

[54] METHOD OF FABRICATING FIELD EFFECT TRANSISTORS HAVING LIGHTLY DOPED DRAIN REGIONS

[75] Inventor: Zahra Hadjizadeh-Amini, Cupertino, Calif.

[73] Assignee: Advanced Micro Devices, Inc., Sunnyvale, Calif.

[21] Appl. No.: 837,536

[22] Filed: Feb. 14, 1992

Related U.S. Application Data

[63] Continuation of Ser. No. 569,773, Aug. 17, 1990, abandoned, which is a continuation of Ser. No. 425,244, Oct. 23, 1989, abandoned.

[51] Int. Cl.$^5$ .......................................... H01L 21/336
[52] U.S. Cl. .................................... 437/44; 437/41; 437/238; 156/643
[58] Field of Search ................... 437/30, 34, 40, 41, 437/44, 56, 57, 235, 238, 241; 357/23.3; 156/643

[56] References Cited

U.S. PATENT DOCUMENTS

| | | | |
|---|---|---|---|
| 4,488,351 | 12/1984 | Momose | 437/34 |
| 4,642,878 | 2/1987 | Maeda | 437/34 |
| 4,728,617 | 3/1988 | Woo et al. | 437/40 |
| 4,735,680 | 4/1988 | Yen | 156/643 |
| 4,818,714 | 4/1989 | Haskell | 437/44 |
| 4,843,023 | 6/1989 | Chiu et al. | 437/41 |
| 4,855,247 | 8/1989 | Ma et al. | 437/44 |

FOREIGN PATENT DOCUMENTS

| | | | |
|---|---|---|---|
| 0218408 | 4/1987 | European Pat. Off. | 437/44 |
| 0241267 | 11/1985 | Japan . | |
| 0257231 | 10/1988 | Japan | 437/44 |

OTHER PUBLICATIONS

Pfiester, "LDD MOSFET's Using Disposable Sidewall Spacer Technology", *IEEE Electron Device Letters*, vol. 9, No. 4, Apr. 1988, pp. 189-192.
Ghandhi, *VLSI Fabrication Principles*, John Wiley & Sons, Inc., 1983, pp. 548-550.
Wolf et al., *Silicon Processing For the VLSI Era, vol. 1: Process Technology*, Lattice Press, 1986, pp. 535-536.

*Primary Examiner*—Mary Wilczewski
*Attorney, Agent, or Firm*—Fliesler, Dubb, Meyer & Lovejoy

[57] ABSTRACT

A method of forming and removing spacers used to mask lightly doped drain (LDD) regions in the formation of a field effect transistor (FET) involves depositing a thin silicon nitride ($Si_3N_4$) layer over the active region of a substrate, a gate structure formed on the active region, and over the field oxide regions. A silicon oxide ($SiO_2$) film is provided over the nitride and then etched to form LDD spacers at the ends of the gate. The etchant used to etch the oxide layer selectively etches oxide at least 20 times faster than nitride. The nitride layer protects the field oxide regions from etching, thereby preventing oxide loss. The spacers are used to mask regions in the substrate during the implantation of source and drain regions, and the masked regions become the LDD regions. After implanting the source and drain regions, the nitride layer may be removed with a wet etchant which selectively etches nitride. The LDD spacers will be lifted off by the removal of the nitride layer or the spacer may be removed with a wet etchant which selectively etches silicon oxide followed by a nitride wet etchant which selectively etches nitride.

2 Claims, 1 Drawing Sheet

METHOD OF FABRICATING FIELD EFFECT TRANSISTORS HAVING LIGHTLY DOPED DRAIN REGIONS

This application is a continuation of Ser. No. 07/569,773, filed Aug. 17, 1990 now abandoned, which is a continuation of Ser. No. 07/425,244 filed Oct. 23, 1989 now abandoned.

CROSS-REFERENCE TO RELATED APPLICATION

METHOD OF DETECTING THE WIDTH OF SPACERS AND LIGHTLY DOPED DRAIN REGIONS, Inventors Yow-Juang (Bill) Liu and Zahra Hadjizadeh Amini, Ser. No. 313,984, filed Feb. 22, 1989, assigned to the Assignee of the subject Application.

BACKGROUND OF THE INVENTION

1. Field of the Invention

The present invention generally relates to the fabrication of field effect transistors (FETs) having lightly-doped drain (LDD) regions; more particularly, to the formation and removal of spacers used in the fabrication of LDD regions.

2. Description of the Related Art

Lightly-doped drain (LDD) regions have commonly been used to reduce the length of the channel region in an FET. Reducing the length of the channel region makes it possible to reduce the size of the FET. The reduction in the length of the channel region is made possible by providing LDD regions which separate the source and drain regions from the channel region, thereby reducing the electric field at the source and drain pinch-off regions, and thus increasing the channel breakdown voltage and reducing electron impact ionization (hot electron effects).

An FET having LDD regions is typically fabricated in an active region of a substrate. The active region has a $P^-$-type background doping and is bounded by field oxide (FOX) regions which electrically isolate the FET from other devices formed in the same substrate. (Either N-type or P-type dopants may be utilized, and the following discussion refers only to N-type dopants for convenience only.) Conventional processing techniques are utilized to implant regions located at both ends of a gate with a light dose of an N-type dopant using the gate as a mask. Two $N^-$ regions formed by the implant define a channel underlying the gate. A spacer material layer is formed over the entire structure and etched so that spacers remain at the ends of the gate. These spacers overlie portions of the $N^-$ regions adjacent to the gate structures. Thereafter, a second implant is performed with a heavier dose of an N-type dopant to form $N^+$ source and drain regions in the $N^-$ regions. During the second implant the spacers mask the underlying $N^-$ regions. The $N^-$ regions which do not receive the second implant become the LDD regions. Thus, the width of the spacers defines the width of the LDD regions.

The conventional manner of forming spacers is to perform a blanket etch of a spacer material layer provided over the entire area of the substrate. Because there are non-uniformities in the thickness of the spacer material layer, and because of non-uniformities of the etching rate over the entire wafer area, there are areas of the wafer where over-etching occurs and other areas where there is an incomplete removal of the spacer material layer. Conventionally, the spacer material layer is an oxide, and it is critical that the oxide layer be completely removed from the top of the source/drain regions. However, when the strength of the etchant and the etching time are adjusted to assure complete removal of the oxide from the source/drain regions, the etchant often removes material from the field oxide regions. Typically, 1,000–2,000 Å of the field oxide is removed. Removal of the field oxide, referred to as oxide loss, reduces the threshold voltage of the FET, and thus is not desirable.

Further, it is desirable to select an etching time based on the desired width of the spacers, rather than basing the etching time on complete removal of the spacer material layer. While the channel breakdown voltage of a LDD FET and its ability to resist hot electron effects can be increased by increasing the width of the LDD regions, the LDD regions can increase the resistance of the transistor channel and degrade the current drive capability of the FET. Consequently, it is important to control the fabrication process so that an optimum LDD width is achieved.

One proposed method of reducing oxide loss is to form the spacer material layer from a thin layer of a thermal oxide, e.g., $SiO_2$, (for protecting the substrate) and a thicker layer of polysilicon overlying the thermal oxide. The polysilicon layer is then etched with an etchant which has a much higher etch rate for polysilicon than for the silicon oxide to form the spacers at the ends of the gate. Because the etchant selectively etches polysilicon, the oxide layer protects the underlying FOX regions from etching, thereby preventing oxide loss.

It is, however, very difficult to remove the polysilicon spacers after the $N^+$ implant since the implant process oxidizes the surface of the polysilicon. Once an oxide layer forms at the surface of the polysilicon, an etchant which is chosen because it will selectively etch polysilicon at a much faster rate than it will etch oxides of silicon loses its selectivity and becomes ineffective for its desired purpose. The device must be exposed to the etchant for a period which is long enough for the etchant to penetrate the oxide skin on the polysilicon spacers, usually a period which allows the etchant to penetrate the oxide layer protecting the source, drain and FOX regions. After penetrating the protective oxide layer, the etchant will attack the substrate in the source and drain regions and the FOX regions causing oxide loss.

SUMMARY OF THE INVENTION

It is, therefore, an object of the present invention to provide a method of forming and removing LDD spacers which reduces or eliminates oxide loss.

A further object of the present invention is to provide a method of forming LDD spacers which compensates for varying etch rates over the area of a substrate.

Another object of the present invention is to provide a method of forming and removing LDD spacers which uses an etch stop layer and a spacer material layer which are formed of materials which can be selectively etched with respect to each other.

Another object of the present invention is to provide a method of fabricating an FET having LDD regions in which oxide loss is avoided.

These and other objects and advantages of the present invention are accomplished by providing an etch stop layer, for example, a silicon nitride ($Si_3N_4$) layer, overlying the substrate, the gate, and the field oxide regions of a partially fabricated FET prior to forming the spacer material layer. The spacer material layer is formed of a material which can be selectively etched with respect to the etch stop layer. If the etch stop layer is formed of nitride, the spacer material layer may be formed of an oxide of silicon, for example, $SiO_2$. An etchant is selected which selectivity etches the spacer material layer so that the nitride layer will not be penetrated by the etchant either during the etching of the spacer material layer to form the LDD spacers or during the etching to remove the LDD spacers.

A method of forming LDD spacers overlying a substrate in accordance with the present invention comprises the steps of (a) providing an etch stop layer overlying the substrate, (b) providing a spacer material layer overlying the etch stop layer, and (c) removing portions of the spacer material layer, to form LDD spacers, with an etchant which selectively etches the spacer material layer faster than the etch stop layer so that the etch stop layer is not penetrated by the etchant during the formation of the LDD spacers.

A method, in accordance with the present invention, of forming a semiconductor device having lightly doped drain regions, comprises the steps of (a) providing a substrate having an active region bounded by field oxide (FOX) regions (b) providing a gate on a portion of the active region (c) providing a layer of silicon nitride over the active region, the gate, and the FOX regions (d) providing a silicon oxide layer over the silicon nitride layer (e) etching the silicon oxide layer to form spacers utilizing an etchant which selectively etches silicon oxide with respect to silicon nitride so that the etchant does not penetrate the silicon nitride layer during the formation of the spacers, and (f) implanting source and drain regions in the substrate using the spacers as masks.

DESCRIPTION OF THE PREFERRED EMBODIMENT

The method of the present invention will be described with reference to the formation of an FET having LDD regions. However, the method is applicable to other processes, for example, processes for fabricating semiconductor devices in which masks are formed and/or removed by etching, or processes in which structures are formed on or removed from the surface of a substrate by etching.

Figure 1:
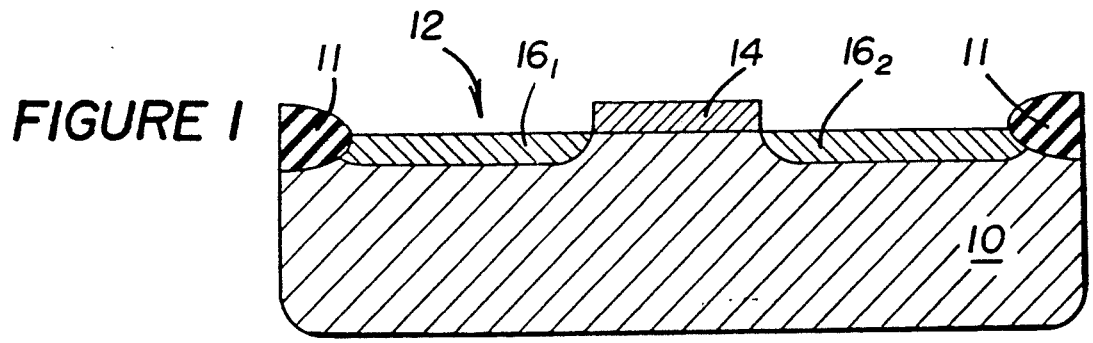
FIGS. 1-4 are partial, sectional views of a semiconductor device useful for describing the method of the subject invention.
Figure 2:
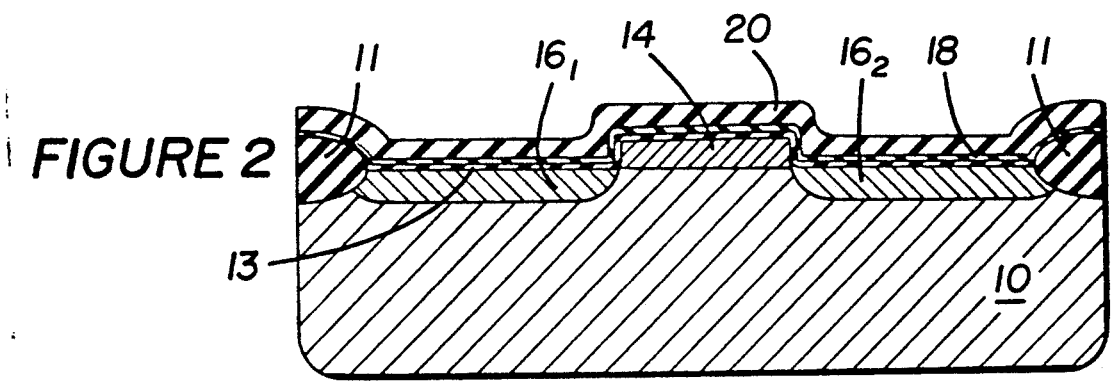

A substrate (a wafer) 10 doped with a background of P-type impurities (e.g., boron) is shown in FIG. 1. The dopant types discussed are used for convenience; note that the method of the present invention applies to the fabrication of both enhancement mode and depletion mode devices. Using conventional fabrication techniques, field oxide regions 11 are formed on substrate 10 to define an active region 12. A gate oxide layer (not shown) is provided on the active region, and then a gate structure 14 is formed on active region 12.

A gate oxidation process forms oxide 13 on gate 14 and on the gate oxide (not shown) previously formed on substrate 10. Then, an N/P implant is used to form lightly doped regions $16_{1-2}$. The implant dosage is selected so that lightly doped regions $16_{1-2}$ have $N^-/P^-$ electrical characteristics. An N-type dopant for use in implanting lightly doped regions $16_{1-2}$ may be, for example, phosphorous or arsenic, and the implant dosage may be, for example, $1 \times 10^{13}$ cm$^{-2}$. A P-type dopant for use in implanting LDD lightly doped regions $16_{1-2}$ may be, for example, boron, and the implant dosage may be, for example, $6 \times 10^{15}$ cm$^{-2}$. Portions of lightly doped regions $16_{1-2}$ become the LDD regions of an FET formed in active region 12.

A thin etch stop layer 18 (approximately 200–500 Å) is formed over substrate 10, oxide 13, gate 14 and over field oxide regions 11. The etch stop layer 18 may be a silicon nitride ($Si_3N_4$) layer formed using conventional techniques. A spacer material layer 20 is then formed over nitride layer 18. In the preferred embodiment, spacer material layer 20 is formed of silicon oxide ($SiO_2$). Alternatively, the spacer material layer 20 may be formed of polysilicon.

Figure 3:
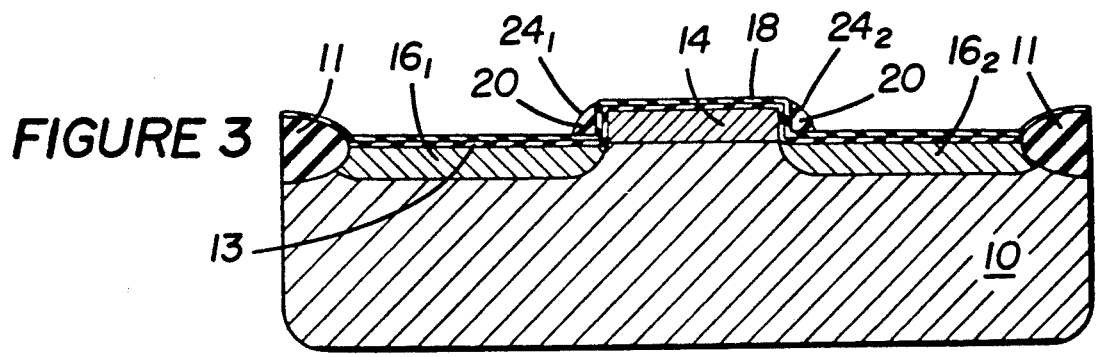

Etch stop layer 18 and spacer material layer 20 may be formed of other materials provided that the selected materials may be selectively etched with respect to each other. An etchant which selectively etches the spacer material layer 20, i.e., etches the spacer material layer at a faster rate (at least 20 times faster) than etch stop layer 18, is used to etch spacer material layer 20 until only spacers $24_{1-2}$ remain at the ends of gate structure 14, as shown in FIG. 3. Etch stop layer 18 is not penetrated by the etchant during the etching of spacer material layer 20, and thus field oxide regions 11 are protected and oxide loss is prevented.

Reactive ion etching (RIE) with an etchant comprising $CHF_3$ and a small amount of $O_2$ is one example of an etching process which may be used to selectively etch spacer material layer 20. One method of detecting, and thus controlling, the width of spacers 24 during the etching process is disclosed in application Ser. No. 313,984, which is hereby incorporated by reference.

Figure 4:
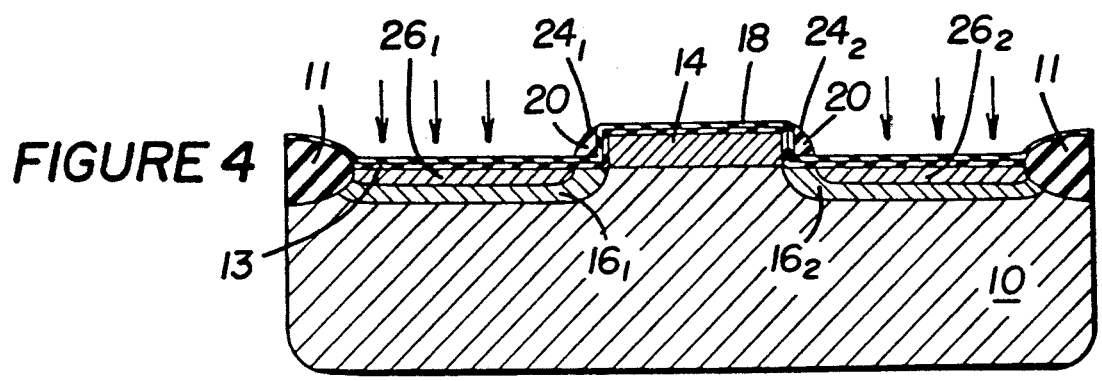

After the formation of spacers $24_{1-2}$, an ion implantation is performed to form $N^+/P^+$ source and drain regions $26_{1-2}$ (FIG. 4) in portions of lightly doped region $16_{1-2}$. The source/drain (S/D) implant is performed in accordance with conventional techniques, well known to those of ordinary skill in the art and may include a diffusion (or activation) of the implanted ions. Oxide layer 13 serves as an implant mask to protect substrate 10 during the S/D implant, and spacers $24_{1-2}$ serve as masks to prevent ion implantation in the portions of lightly doped regions $16_{1-2}$ underlying spacers $24_{1-2}$. These protected portions of lightly doped regions $16_{1-2}$ are the LDD regions of the FET.

Nitride layer 18 can be removed by a wet etch after the S/D implant. Etchants useful in removing nitride layer 18 by wet etching include transene (16 $H_3PO_4$: 1 $HNO_3$: 1 Acetic acid: 2 $H_2O$). As nitride layer 18 is removed, the removal process also lifts off spacers 24.

Another method of removing the nitride layer 18 is to remove spacers 24 with hydrofluoric acid and then to remove the nitride layer with a combined wet/dry etch. In the wet/dry etch the etchant selectively etches nitride layer 18, the wet etchant may be transene and the dry etchant may be $NF_3$ and $SF_6$. Alternatively, nitride layer 18 may be left in the FET.

The many features and advantages of the method of the present invention will be apparent to those skilled in the art from the specification. The disclosed embodiments are therefore to be considered to be illustrative and not restrictive, the scope of the invention being defined by the claims rather than the foregoing description.

What is claimed is:

1. A method of fabricating a field effect transistor (FET) having lightly doped drain regions, comprising the sequential steps of:
    (a) providing a substrate having an active region defined by field oxide regions;
    (b) providing a gate overlying a first portion of the active region;
    (c) oxidizing the exposed portions of the gate;
    (d) implanting lightly doped regions in the active region using the gate as a mask;
    (e) providing a silicon nitride layer overlying the active region, the gate, and overlying the field oxide regions;
    (f) providing a silicon oxide layer overlying the silicon nitride layer;
    (g) etching the silicon oxide layer to form LDD spacers at the edges of the gate using an etchant which has a selectivity of at least 20:1 for silicon oxide with respect to silicon nitride; and
    (h) implanting source and drain regions in respective ones of the lightly doped drain regions using the LDD spacers as masks.

2. A method according to claim 1, further comprising the step of:
    (i) removing the nitride layer and the overlying spacers using an etchant which has a selectivity of at least 20:1 for silicon nitride with respect to silicon oxide.

* * * * *